United States Patent
Wang

(10) Patent No.: US 7,743,288 B1
(45) Date of Patent: Jun. 22, 2010

(54) BUILT-IN AT-SPEED BIT ERROR RATIO TESTER

(75) Inventor: Shoujun Wang, Kanata (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/142,961

(22) Filed: Jun. 1, 2005

(51) Int. Cl.
G06F 11/00 (2006.01)
G01R 31/28 (2006.01)
G08C 25/00 (2006.01)
H04L 1/00 (2006.01)

(52) U.S. Cl. ............. 714/704; 714/742; 714/799; 714/798; 714/703; 714/705

(58) Field of Classification Search ......... 714/703, 714/704, 705, 742, 798, 799
See application file for complete search history.

(56) References Cited

U.S. PATENT DOCUMENTS

| | | | | |
|---|---|---|---|---|
| 5,787,114 A * | 7/1998 | Ramamurthy et al. | ...... | 375/221 |
| 6,396,889 B1 * | 5/2002 | Sunter et al. | ...... | 375/376 |
| 6,463,109 B1 * | 10/2002 | McCormack et al. | ...... | 375/355 |
| 6,628,621 B1 * | 9/2003 | Appleton et al. | ...... | 370/249 |
| 6,760,873 B1 * | 7/2004 | Hao et al. | ...... | 714/724 |
| 7,032,139 B1 | 4/2006 | Iryami et al. | | |
| 7,069,458 B1 * | 6/2006 | Sardi et al. | ...... | 713/401 |
| 7,099,424 B1 * | 8/2006 | Chang et al. | ...... | 375/370 |
| 7,120,838 B2 * | 10/2006 | Casper et al. | ...... | 714/700 |
| 7,130,367 B1 * | 10/2006 | Fu et al. | ...... | 375/376 |
| 7,142,623 B2 * | 11/2006 | Sorna | ...... | 375/376 |
| 7,194,666 B1 * | 3/2007 | Wong et al. | ...... | 714/704 |
| 7,349,510 B2 * | 3/2008 | Best et al. | ...... | 375/355 |
| 2003/0212930 A1 * | 11/2003 | Aung et al. | ...... | 714/700 |
| 2003/0223526 A1 * | 12/2003 | Sorna | ...... | 375/376 |
| 2004/0019844 A1 * | 1/2004 | Goodnow et al. | ...... | 714/798 |
| 2004/0123199 A1 * | 6/2004 | Tan | ...... | 714/728 |
| 2004/0140837 A1 * | 7/2004 | Venkata et al. | ...... | 327/235 |
| 2005/0050190 A1 | 3/2005 | Dube | | |
| 2005/0097420 A1 * | 5/2005 | Frisch et al. | ...... | 714/742 |
| 2005/0246601 A1 * | 11/2005 | Waschura | ...... | 714/724 |
| 2006/0200708 A1 * | 9/2006 | Gentieu et al. | ...... | 714/704 |
| 2006/0209710 A1 * | 9/2006 | Watanabe | ...... | 370/252 |
| 2007/0011534 A1 * | 1/2007 | Boudon et al. | ...... | 714/732 |

OTHER PUBLICATIONS

Tektronix, Inc., "Understanding and Characterizing Timing Jitter," www.Tektronix.com/jitter, pp. 1-23, 2003.
IEEE, Annex 48B, "Jitter test methods," Std. 802.3ae-2002, pp. 505-514, 2002.
U.S. Appl. No. 10/725,898, filed Dec. 1, 2003, San Wong et al.

(Continued)

*Primary Examiner*—Kevin L Ellis
*Assistant Examiner*—Guerrier Merant
(74) *Attorney, Agent, or Firm*—Ropes & Gray LLP; Robert R. Jackson

(57) ABSTRACT

A built-in, at-speed BERT is provided that may be part of high-speed serial interface circuitry implemented on an integrated circuit. The built-in, at-speed BERT takes advantage of an existing clock data recovery (CDR) dual-loop architecture and built-in self test (BIST) circuitry. The built-in, at-speed BERT provides a low-cost solution for production testing of high-speed serial links, facilitating jitter analysis and evaluation of pre-emphasis and equalization performance. This further allows adaptation of pre-emphasis and equalization.

24 Claims, 7 Drawing Sheets

OTHER PUBLICATIONS

"Jitter Fundamentals: Agilent N4900 Serial BERT Series Jitter Injection and Analysis Capabilities," Application Note, Agilent Technologies, Nov. 2003, pp. 1-24.

"Understanding and Characterizing Timing Jitter," Tektronix, www.tektronix.com/jitter, 2003, pp. 1-24.

"Annex 48B: Jitter test methods," IEEE Std 802.3ae-2002,IEEE, 2002, pp. 505-514.

Wang, et al., "Equalization Techniques," Carleton University, presentation slides.

* cited by examiner

BUILT-IN AT-SPEED BIT ERROR RATIO TESTER

BACKGROUND OF THE INVENTION

The invention relates to a bit error ratio tester (BERT). More particularly, the invention relates to a low-cost, built-in, at-speed BERT for production testing of high-speed serial links.

The input/output throughput of integrated circuits, for example, programmable logic devices, is currently on the order of gigabits per second and continues to rise. With this high rate of data throughput, an area of concern arises with regard to the bit error ratio. The higher the bit error ratio of a particular device, the more bits that need to be retransmitted, thus decreasing the overall data transfer rate. This clearly makes inefficient the high throughput rates of some of these devices when a high bit error ratio is present.

It therefore becomes important to be able to gauge the bit error ratio of any particular device or type of device. Knowing the bit error ratio of devices allows designers and engineers to choose appropriate devices that are required to exhibit a particular (e.g., minimum) data transfer rate for a particular design or application.

Bit error ratios are typically ascertained through the use of a bit error ratio tester (BERT). A BERT includes a pattern generator and an error detector/analyzer that are used to construct a bathtub curve (also known as a BERT scan). The bathtub curve is a plot of the bit error ratio versus sampling time that is generated by stepping a sampling point across a data eye. The conventional bathtub curve test requires a stand-alone BERT which is expensive and unsuitable for low-cost production testing of high-speed serial links.

It would therefore be desirable to provide a low-cost, built-in, at-speed BERT for production testing of high-speed serial links.

SUMMARY OF THE INVENTION

In accordance with the invention, a low-cost, built-in, at-speed BERT for production testing of high-speed serial links is provided.

The built-in, at-speed BERT may be part of data processing circuitry such as, for example, high speed serial interface (HSSI) circuitry or other suitable circuitry. The data processing circuitry may be on an integrated circuit (IC) such as, for example, a programmable logic device (PLD), a complex programmable logic device (CPLD), an erasable programmable logic device (EPLD), an electrically erasable programmable logic device (EEPLD), a field programmable gate array (FPGA), an application-specific standard product (ASSP), an application-specific integrated circuit (ASIC), or other suitable IC.

The BERT may be efficiently used to test the bit error ratios of any interfaces associated with the IC, including any input/output components that interface the IC with external devices or any input/output components internal to the IC, such as memory interfaces accessible via intra-IC resources. The BERT may also be used as stand-alone testing equipment for testing the bit error ratio of external devices that are distinct and independent from the IC in which the BERT is implemented.

The BERT takes advantage of an existing clock data recovery (CDR) dual-loop architecture and built-in self test (BIST) circuitry that are part of the data processing circuitry. The CDR dual-loop architecture includes a frequency acquisition loop and a data phase tracking loop. The frequency acquisition loop is a phase frequency detector (PFD) based phase-locked loop (PLL) that locks to an input CDR reference clock. During normal operation mode, this loop generates a recovered clock that is similar in frequency to the data rate of input data. The data phase tracking loop is a phase detector (PD) based PLL that locks to input data. During normal operation mode, this loop adjusts the phase of the recovered clock in order to recover the clock signal embedded in the input data. Processing in the frequency acquisition loop or the data phase tracking loop is controlled by a lock detector.

The BIST circuitry includes a pseudo random binary sequence (PRBS) generator and a bit error ratio (BER) checker. A transmission path generates PRBS data that is transmitted to a device under test (DUT). A reception path recovers the PRBS data from the DUT and calculates the bit error ratio.

During a bathtub curve test mode (i.e., during BIST mode), the lock detector is set to activate the frequency acquisition loop and an additional variable delay line is provided to move the sampling point of the input data in time. The variable delay line, which is provided between the system clock and the CDR reference clock, provides coarse-tuning and fine-tuning adjustment of the sampling point. In a loopback configuration, the input data synchronizes with a system clock through a clock multiplier unit (CMU) while the sampling clock generated by the frequency acquisition loop synchronizes with the CDR reference clock. Thus, the movement of the sampling clock with respect to the data eye can be achieved by adjusting the variable delay line. During the bathtub curve test, the bit error ratio is recorded while the sampling clock is swept across the data eye. For the backplane environment where pre-emphasis and equalization are used to counteract intersymbol interference (ISI), the bathtub curve approach can provide an intuitive eye opening indication of pre-emphasis and equalization performance.

The built-in, at-speed BERT provides a low-cost solution for production testing of high-speed serial links, facilitating jitter analysis and evaluation of pre-emphasis and equalization performance.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

A bit error ratio tester (BERT) is used to construct a bathtub curve (i.e., a BERT scan). The bathtub curve is a plot of the bit error ratio versus sampling time that is generated by stepping a sampling point across a data eye. The bathtub curve is useful for determining jitter and eye opening for high speed serial links. A receiver ideally samples the eye at the center where the overlap of the transition histograms (i.e., bit error ratio) is small. Data jitter will move the transition edges toward the center of the eye diagram, resulting in eye closure. As the sampling point is continually moved into the edges of the eye, the bit error ratio will steadily increase. The total jitter and eye opening at a specified bit error ratio is readily available from the bathtub curve. Jitter includes random jitter and deterministic jitter. The random jitter determines the slope of the bathtub curve while the deterministic jitter determines the inset of the slope from the edges of the bathtub curve. The bathtub curve also provides a mechanism to extrapolate lower bit error ratios to reduce test times.

Figure 1:
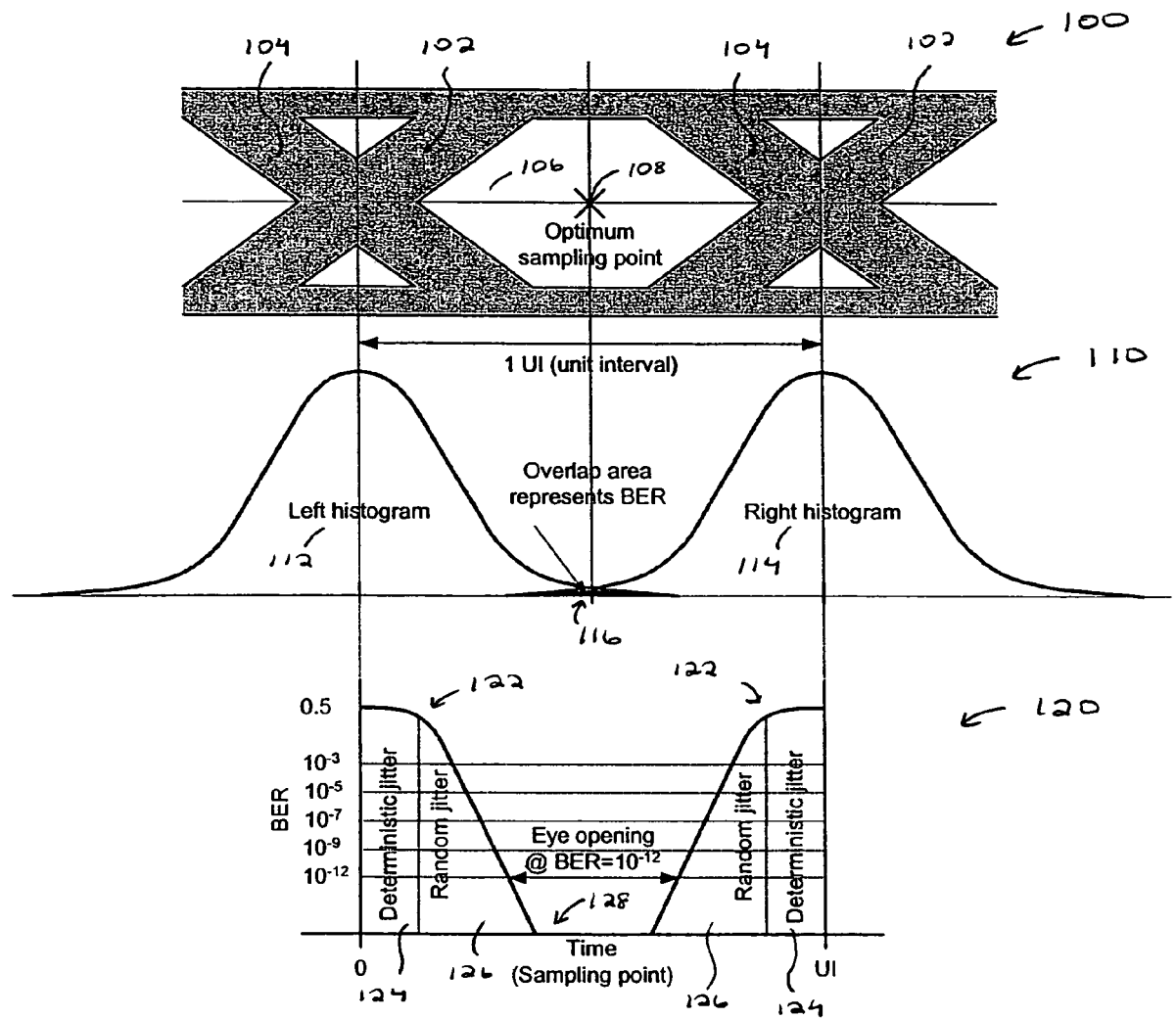
FIG. 1 shows an eye diagram, histograms, and a bathtub curve.

FIG. 1 shows an eye diagram, histograms, and a bathtub curve. Diagram 100 illustrates an eye diagram which is a superimposition of short segments of an input signal waveform. Sections 102 show the superimposition of the rising edges (i.e., the transition from binary "0" to binary "1") for the various short segments while sections 104 show the superimposition of the falling edges (i.e., the transition from binary "1" to binary "0") for the various short segments. Sections 102 and 104 reflect the amount of jitter in the input signal waveform. In-between section 102 on the left and section 104 on the right is the eye opening 106. Input data is preferably sampled within eye opening 106 to ensure that the correct input data bit is read. The optimal sampling point is at the center 108 of eye opening 106. As the amount of jitter increases, eye opening 106 becomes smaller. As the amount of jitter decreases, eye opening 106 becomes larger.

Diagram 110 illustrates histograms of the transition regions 102 for the input signal waveform shown in diagram 100. The transition histograms represent probability density functions (PDFs) of the jitter and describe the transition times. Between the left histogram 112 and the right histogram 114 is the eye opening. The area 116 under the overlapped region of the left histogram 112 and the right histogram 114 represents the probability that a transition will cause an error due to jitter (i.e., the bit error ratio). The receiver ideally samples the eye in-between the left histogram 112 and the right histogram 116 where the bit error ratio is the smallest. The bit error ratio is smallest in the center of the eye opening.

Diagram 120 illustrates the bathtub curve for the eye diagram in diagram 100 and the histograms in diagram 110. The bathtub curve represents the bit error ratio versus sampling time swept across the data eye. The bathtub curve shows the total jitter 122 and the eye opening 128. The total jitter 122 includes deterministic jitter 124 and random jitter 126.

In accordance with the invention, the built-in, at-speed BERT may be part of data processing circuitry such as, for example, high speed serial interface (HSSI) circuitry or other suitable circuitry. The data processing circuitry may be on an integrated circuit (IC) such as, for example, a programmable logic device (PLD), a complex programmable logic device (CPLD), an erasable programmable logic device (EPLD), an electrically erasable programmable logic device (EEPLD), a field programmable gate array (FPGA), an application-specific standard product (ASSP), an application-specific integrated circuit (ASIC), or other suitable IC.

The BERT may be efficiently used to test the bit error ratios of any interfaces associated with the IC, including any input/output components that interface the IC with external devices or any input/output components internal to the IC, such as memory interfaces accessible via intra-IC resources. The BERT may also be used as stand-alone testing equipment for testing the bit error ratio of external devices that are distinct and independent from the IC in which the BERT is implemented.

The BERT takes advantage of an existing clock data recovery (CDR) dual-loop architecture and built-in self test (BIST) circuitry that are part of the data processing circuitry. The CDR dual-loop architecture includes a frequency acquisition loop and a data phase tracking loop. The frequency acquisition loop is a phase frequency detector (PFD) based phase-locked loop (PLL) that locks to an input CDR reference clock. During normal operation mode, this loop generates a recovered clock that is similar in frequency to the data rate of input data. The data phase tracking loop is a phase detector (PD) based PLL that locks to input data. During normal operation mode, this loop adjusts the phase of the recovered clock in order to recover the clock signal embedded in the input data. Processing in the frequency acquisition loop or the data phase tracking loop is controlled by a lock detector.

The BIST circuitry includes a pseudo random binary sequence (PRBS) generator and a bit error ratio (BER) checker. A transmission path generates PRBS data that is transmitted to a device under test (DUT). A reception path recovers the PRBS data from the DUT and calculates the bit error ratio.

During a bathtub curve test mode (i.e., during BIST mode), the lock detector is set to activate the frequency acquisition loop and an additional variable delay line is provided to move the sampling point of the input data in time. The variable delay line, which is provided between the system clock and the CDR reference clock, provides coarse-tuning and fine-tuning adjustment of the sampling point. In a loopback configuration, the input data synchronizes with a system clock through a clock multiplier unit (CMU) while the sampling clock generated by the frequency acquisition loop synchronizes with the CDR reference clock. Thus, the movement of the sampling clock with respect to the data eye can be achieved by adjusting the variable delay line. During the bathtub curve test, the bit error ratio is recorded while the sampling clock is swept across the data eye. For the backplane environment where pre-emphasis and equalization are used to counteract intersymbol interference (ISI), the bathtub curve approach can provide an intuitive eye opening indication of pre-emphasis and equalization performance.

Figure 2:
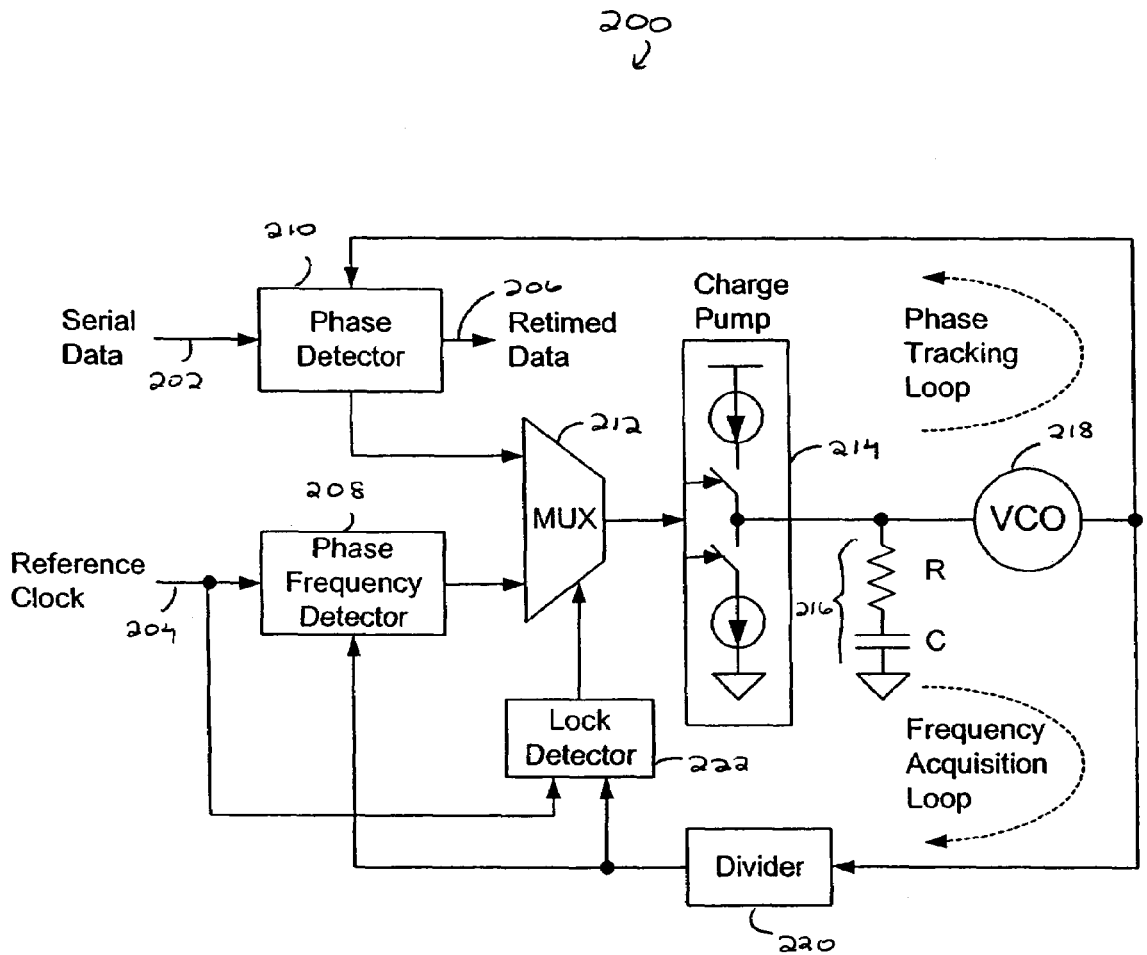
FIG. 2 is a simplified block diagram of clock data recovery (CDR) circuitry in accordance with an embodiment of the invention.

FIG. 2 shows a CDR dual-loop architecture 200 that processes data in a frequency acquisition loop and a phase tracking loop during normal operation mode. CDR circuitry 200 receives as input serial data signal 202 and a CDR reference clock signal 204 and sends as output retimed data 206. The frequency acquisition loop includes a phase frequency detector 208, a multiplexer 212, a charge pump 214, a loop filter 216, a voltage controlled oscillator (VCO) 218, and a divider circuit 220. The phase tracking loop includes a phase detector 210, multiplexer 212, charge pump 214, loop filter 216, and VCO 216. The processing of data in the frequency acquisition loop or phase tracking loop is controlled by a lock detector 220.

During frequency acquisition mode, phase frequency detector 208 receives as input reference clock signal 204 and an output signal from divider circuit 220. Phase frequency detector 208 compares the phase and frequency of the two signals it receives and outputs a signal indicative of whether the output signal of divider circuit 220 should be speeded up or slowed down to better match the phase and frequency of reference clock 204. The output of phase frequency detector 208 is sent as input to multiplexer 212 which is controlled by lock detector 222. The output of multiplexer 212 is sent as input to charge pump 214 and loop filter 216. Charge pump 214 and loop filter 216 integrate the output signal from phase frequency detector 208 and produce a VCO current control signal to control VCO 218. VCO 218 outputs a recovered clock signal that better matches reference clock 204 with respect to phase and frequency. The output of VCO 218 is applied to divider circuit 220. Divider circuit 220 divides the VCO output signal frequency by a predetermined scale factor to produce an output signal that is input to phase frequency detector 208 and lock detector 222.

During phase tracking mode, phase detector 210 receives as input serial data signal 202 and an output signal from VCO 218. Phase detector 210 compares the phases of the signals it receives and outputs a signal indicative of whether the output signal of VCO 218 should be speeded up or slowed down to better match the phase of serial data signal 202. The output of phase detector 210 is sent as input to multiplexer 212, and then to charge pump 214, loop filter 216, and VCO 218. VCO 218 outputs a clock signal that better matches the clock signal in serial data signal 202 with respect to phase. The output of VCO 218 is applied to phase detector 210 which sends as output retimed data 206.

Lock detector 222 receives as input the output of divider circuit 220 and reference clock 204 and sends as output a signal used to control multiplexer 212. Lock detector 222 compares the frequency of the signal from divider 220 to the frequency of reference clock 204. When the frequency difference between the signal from divider 220 and reference clock 204 is greater than a predetermined parts per million (PPM) (e.g., 500 PPM), lock detector 222 sends a signal causing multiplexer 212 to select the signal from phase frequency detector 208 (i.e., frequency acquisition mode). When the frequency difference between the signal from divider 220 and reference clock 204 is within the predetermined PPM, lock detector 222 sends a signal causing multiplexer 212 to select the signal from phase detector 210 (i.e., phase tracking mode).

Figure 3:
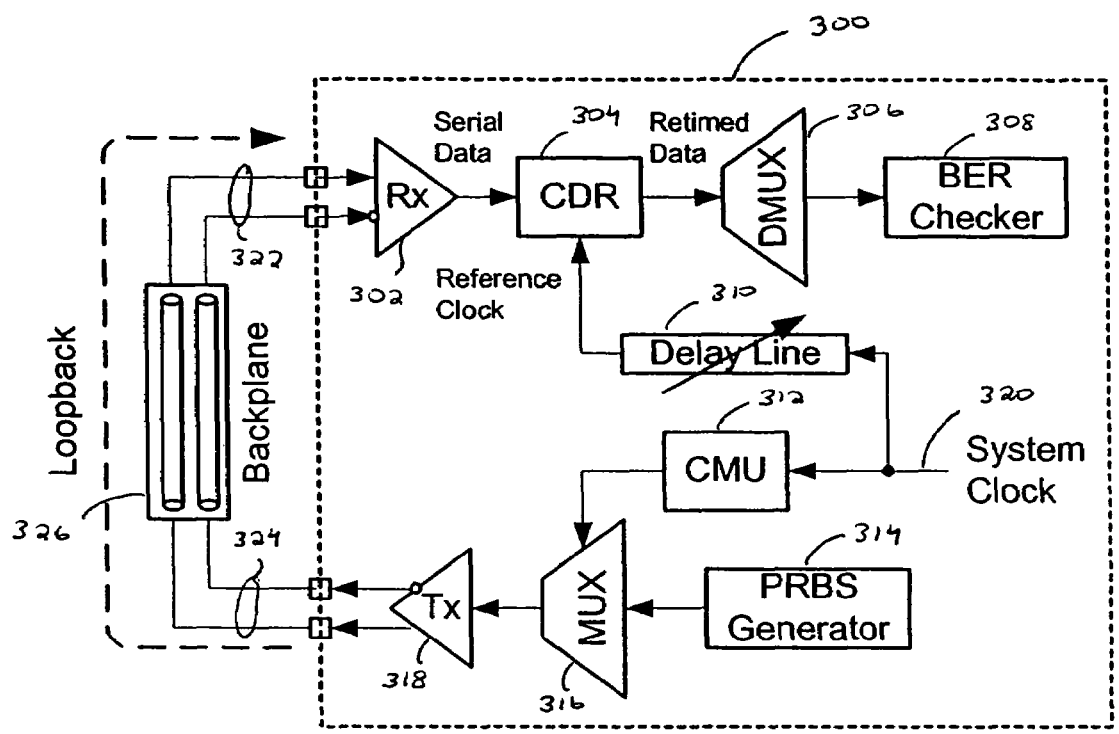
FIG. 3 is a simplified block diagram of circuitry having a built-in, at-speed bit error ratio tester (BERT) in accordance with an embodiment of the invention.

FIG. 3 shows a programmable logic device (PLD) 300 employing a built-in, at-speed BERT in accordance with an embodiment of the invention. Although the invention is primarily described herein as implementing the BERT on a PLD for clarity, the BERT may also be implemented on any other suitable device. Device 300 includes receiver circuitry for receiving as input data 322 from a backplane 326 and transmitter circuitry for sending as output data 324 to backplane 326. Backplane 326 can be used to allow device 300 to interface with an external device or to allow the receiver circuitry to interface directly with the transmitter circuitry. The receiver circuitry includes a receiver driver 302, CDR circuitry 304 (e.g., circuitry 200 in FIG. 2), a deserializer (e.g., DMUX) 306, and a BER checker 308. CDR circuitry 304 receives a reference clock from a system clock 320 via a variable delay line 310. The transmitter circuitry includes a clock multiplier unit (CMU) 312, a PRBS generator 314, a serializer (e.g., MUX) 316, and a transmitter driver 318. Although FIG. 3 is primarily described herein as having these receiver and transmitter circuitry components for clarity, device 300 may include additional or fewer components, or any other suitable combination of components.

Most devices 300 include built-in-self-test (BIST) circuitry such as PRBS generator 314 and BER checker 308 to facilitate on-chip BER test. With the BIST circuitry, device 300 can perform a similar functionality as the BERT. PRBS generator 314 generates PRBS data that is transmitted to a device under test (DUT) (e.g., using backplane 326) via MUX 316 and driver 318. BER checker 308 recovers the PRBS data via driver 302, CDR 304, and DMUX 306 and calculates the BER.

System clock 320 is sent as input to a variable delay line 310 to generate a moving reference clock signal that is input to CDR 304 during a bathtub curve test mode. The movement of the reference clock signal with respect to the data eye can be achieved by adjusting the delay line.

Figure 4:
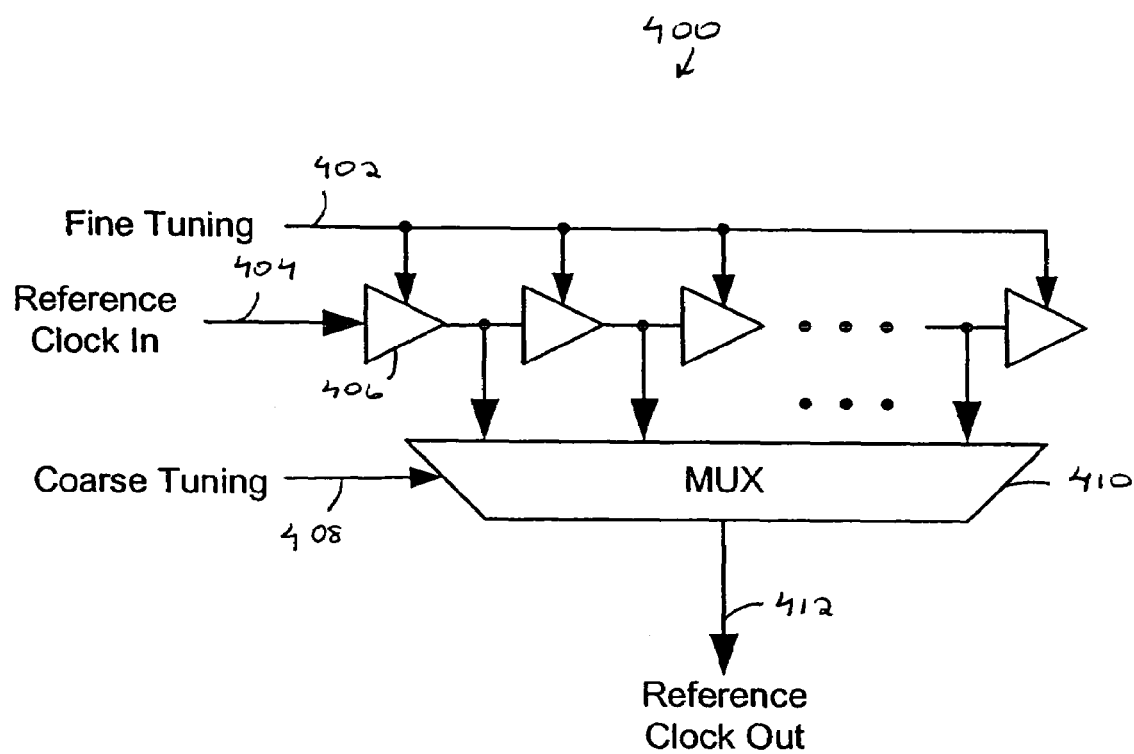
FIG. 4 is a schematic diagram of the variable delay line shown in FIG. 3 in accordance with an embodiment of the invention.

FIG. 4 shows a variable delay line 400 (e.g., delay line 310 in FIG. 3) in accordance with the invention. Variable delay line 400 receives as input a reference clock In signal 404 (e.g., system clock signal 320), a fine tuning signal 402, and a coarse tuning signal 408. Variable delay line 400 includes one or more delay elements 406 arranged serially. Reference clock In signal 404 is sent as input to a first delay element 406, with the output of the first delay element 406 sent as input to a next delay element 406. Delay elements 406 are controlled by fine tuning signal 402. The output of each delay element 306 is sent as input to a multiplexer 410, which is controlled by coarse tuning signal 408. Coarse tuning signal 408 allows for reference clock In signal 404 to be sampled at predetermined delay units while fine tuning signal 402 allows for reference clock In signal 404 to be sampled at smaller predetermined delay units. The output 412 of multiplexer 410 is sent as input (e.g., reference clock signal 204) to CDR circuitry 304.

For the backplane environment, the bathtub curve approach can provide an intuitive eye opening indication of pre-emphasis and equalization performance. During data transmission through the backplane channel, signal attenuation occurs that causes ISI, a type of deterministic jitter. In order to counteract the ISI, circuitry can be provided on the PLD (e.g., on PLD 300) to boost the data signal prior to being transmitted onto the backplane and/or after being received from the backplane, thus increasing the eye opening and decreasing the jitter. Pre-emphasis can be provided on the transmitter side of the PLD while equalization can be provided on the receiver side of the PLD. Because the output of the pre-emphasis is connected to the backplane, the effect of pre-emphasis can be easily measured. On the other hand, the input of the equalization is connected to the backplane, and therefore, the effect of equalization cannot be easily measured.

The bathtub curve approach further allows adaptation of pre-emphasis and equalization. The measured eye opening information can be used to adjust the amount of pre-emphasis and/or equalization in order to achieve the desired eye opening. For example, if a larger eye opening is desired, the pre-emphasis and/or equalization can be increased.

Figure 5:
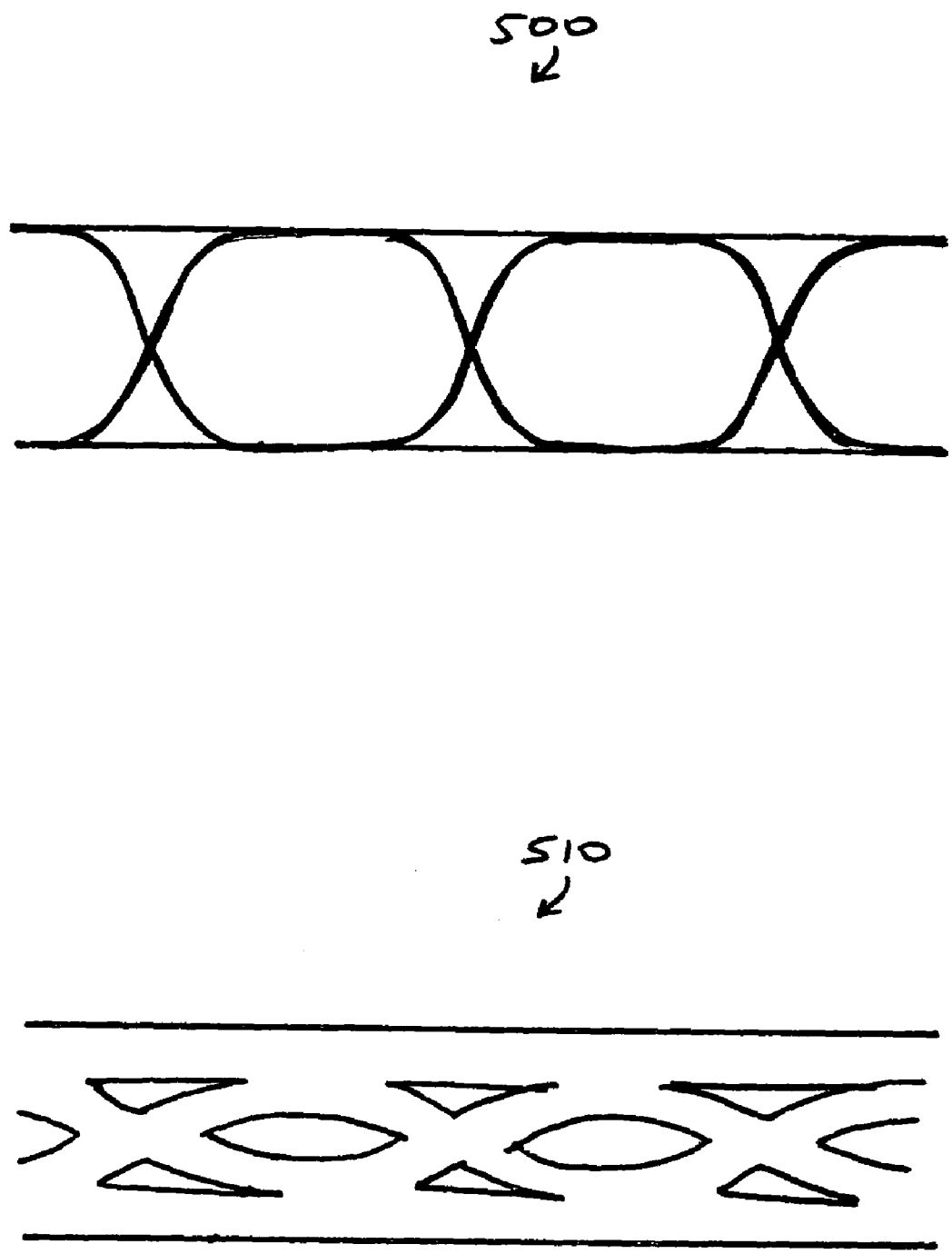
FIG. 5 shows diagrams at the near-end and far-end of a backplane channel.
Figure 6:
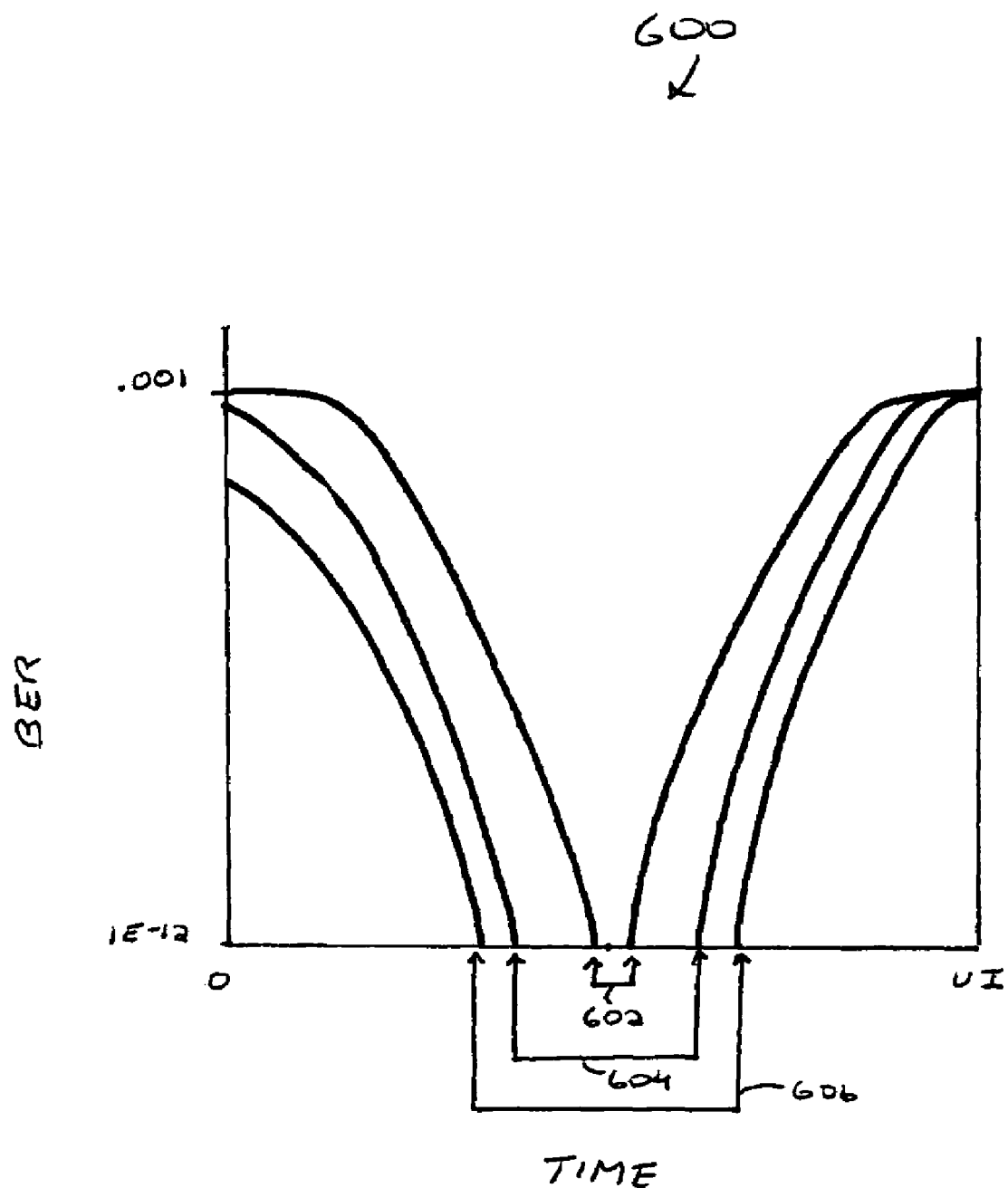
FIG. 6 shows bathtub curves with different pre-emphasis or equalization levels.

FIG. 5 shows eye diagrams at the near-end (500) and far-end (510) of a backplane channel. The backplane channel causes eye closure due to ISI. Diagram 510 at the far-end of the backplane channel has a smaller eye opening and more jitter than diagram 500 at the near-end of the backplane channel. FIG. 6 shows the bathtub curves 602, 604, and 606 with different pre-emphasis and/or equalization levels applied. As the pre-emphasis and/or equalization increases, the eye opening increases (e.g., curve 606 has a larger eye opening than curve 604 which has a larger eye opening than curve 602).

Figure 7:
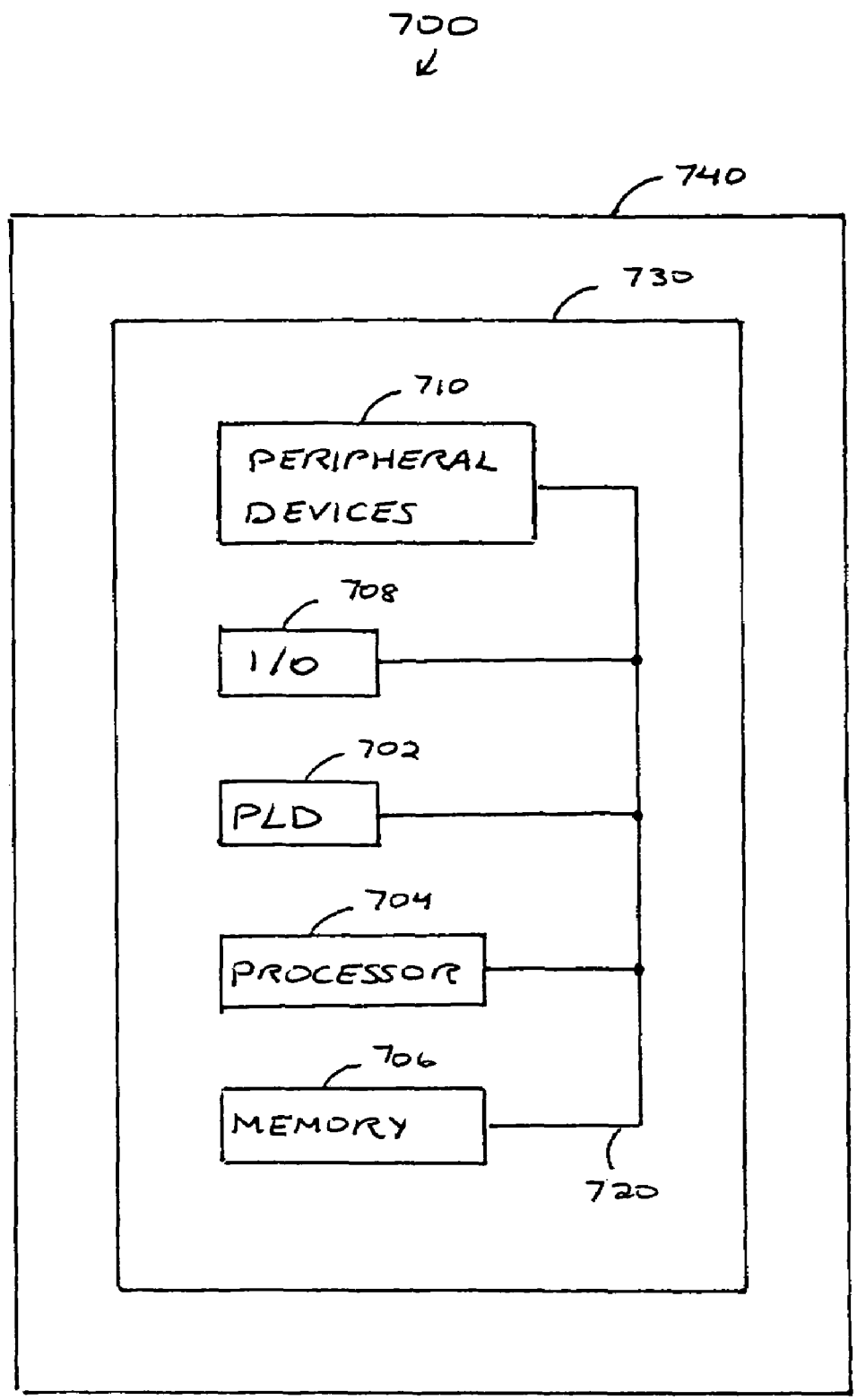
FIG. 7 is a simplified block diagram of an illustrative system employing circuitry in accordance with an embodiment of the invention.

FIG. 7 illustrates a programmable logic device 702 (i.e., PLD 300) of this invention (i.e., having a BERT implemented thereon) in a data processing system 500 in accordance with one embodiment of the present invention. Data processing system 700 may include one or more of the following components: a processor 704; memory 705; input/output circuitry 708; and peripheral devices 710. These components are coupled together by a system bus 720 and are populated on a circuit board 730 which is contained in an end-user system 740.

System 700 can be used in a wide variety of applications, such as computer networking, data networking, instrumentation, video processing, digital signal processing, or any other application where the advantage of using programmable or reprogrammable logic is desirable. PLD 702 can be used to perform a variety of different logic functions. For example, PLD 702 can be configured as a processor or controller that works in cooperation with processor 704. PLD 702 may also be used as an arbiter for arbitrating access to a shared resource in system 700. In yet another example, PLD 702 can be configured as an interface between processor 704 and one of the other components in system 700. It should be noted that system 700 is only exemplary, and that the true scope and spirit of the invention should be indicated by the following claims.

Various technologies can be used to implement PLD 702 having the features of this invention, as well as the various components of those devices (e.g., programmable logic connectors ("PLCs") and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). For example, FCEs can be SRAMS, DRAMS, magnetic RAMS, ferro-electric RAMS, first-in first-out ("FIFO") memories, EPROMS, EEPROMs, function control registers, ferro-electric memories, fuses, antifuses, or the like. From the various examples mentioned above it will be seen that this invention is applicable to both one-time-only programmable and reprogrammable resources.

Thus, a low-cost, built-in, at-speed BERT for production testing of high-speed serial links is provided. One skilled in the art will appreciate that the present invention can be practiced by other than the described embodiments, which are presented for purposes of illustration and not of limitation, and the present invention is limited only by the claims which follow.

What is claimed is:

1. An integrated circuit device on which is implemented a bit error ratio tester that tests the bit error ratio of a device under test (DUT), comprising:
   a variable delay line that receives as input a first clock signal and is operative to variably phase-delay the first clock signal to produce a second clock signal having phase that steps, in time, across a data eye of a data signal containing jitter from the DUT;
   transmitter circuitry that receives as input the first clock signal and is operative to generate and transmit pseudo-random binary sequence (PRBS) data, synchronized with the first signal, to the DUT; and
   receiver circuitry that receives as input the data signal from the DUT and the second clock signal, and is operative to use the second clock signal to recover the PRBS data from the data signal and to determine, for each of the steps in the phase of the second clock signal, a bit error ratio of the recovered PRBS data, wherein the receiver circuitry comprises:
      circuitry that outputs a first control signal based on a frequency associated with the second clock signal,
      circuitry that outputs a second control signal based on the data signal, and
      selection circuitry that selects as output one of the first and second control signals based on the frequency associated with the second clock signal.

2. The device of claim 1 wherein the variable delay line circuitry is operative to phase delay the first clock signal by one of a plurality of predetermined delay units.

3. The device of claim 1 wherein the transmitter circuitry comprises:
   a PRBS generator operative to generate the PRBS data;
   a clock multiplier unit that receives as input the first clock signal and is operative to multiply the first clock signal by a predetermined value; and
   a serializer that receives as input the PRBS data and is operative to output the PRBS data serially based on the multiplied first clock signal.

4. The device of claim 1 wherein the receiver circuitry further comprises:
   clock data recovery circuitry that receives as input the second clock signal and the data signal, and is operative to recover the PRBS data in the data signal based on the second clock signal;
   a deserializer that receives as input the recovered PRBS data and is operative to output the PRBS data in parallel; and
   a bit error ratio checker that receives as input the recovered PRBS data from the deserializer and is operative to determine, for each of the steps in the phase of the second clock signal, the bit error ratio of the recovered PRBS data.

5. The device of claim 1 wherein the clock data recovery circuitry comprises:
   first circuitry that receives as input a clock signal having phase at one of the steps in the phase of the second clock signal and is operative to generate a third clock signal phase-locked to the one of the steps in the phase of the second clock signal, and
   second circuitry that receives as input the data signal and the third clock signal and is operative to use the third clock signal to recover the PRBS data from the data signal.

6. The device of claim 1 wherein the transmitter circuitry comprises pre-emphasis circuitry and the receiver circuitry comprises equalization circuitry, the pre-emphasis circuitry and the equalization circuitry both operative (1) to decrease the bit error ratio of the recovered PRBS data and (2) to be adapted based on the bit error ratio of the recovered PRBS data.

7. A digital processing system comprising:
   processing circuitry;
   a memory coupled to the processing circuitry; and
   an integrated circuit device defined in claim 1 coupled to the processing circuitry and the memory.

8. A printed circuit board on which is mounted the integrated circuit device as defined in claim 1.

9. The printed circuit board defined in claim 8 further comprising:
   a memory mounted on the printed circuit board and coupled to the integrated circuit device.

10. The printed circuit board defined in claim 8 further comprising:

processing circuitry mounted on the printed circuit board and coupled to the integrated circuit device.

11. The device of claim 1 wherein the selection circuitry selects based on a difference between the frequency associated with the second clock signal and a frequency associated with a divided clock signal being greater than a predetermined parts per million.

12. An integrated circuit device on which is implemented a bit error ratio tester that tests the bit error ratio of a device under test (DUT), comprising:
first circuitry operative to generate and transmit test data to the DUT;
second circuitry operative to receive a data signal containing jitter from the DUT and to recover the test data from the data signal using a clock signal derived from a system clock and having phase that steps, in time, across a data eye of the data signal, wherein the second circuitry comprises:
circuitry that outputs a first control signal based on a frequency associated with the clock signal,
circuitry that outputs a second control signal based on the data signal,
selection circuitry that selects as output one of the first and second control signals based on the frequency associated with the clock signal; and
third circuitry operative to determine, for each of the steps in the phase of the clock signal, a bit error ratio of the recovered test data.

13. The device of claim 12 wherein:
the first circuitry comprises a pseudo-random binary sequence generator; and
the third circuitry comprises a bit error ratio checker.

14. The device of claim 12 further comprising:
a clock multiplier unit operative to multiply the system clock by a predetermined value; and
a serializer operative to output the PRBS data from the first circuitry serially based on the multiplied system clock.

15. The device of claim 12 wherein the second circuitry further comprises:
a variable delay line operative to phase delay the system clock by a plurality of predetermined delay units to generate the plurality of steps in the phase of the clock signal;
clock data recovery circuitry operative to recover the PRBS data from the data signal based on the clock signal; and
a deserializer operative to output the recovered PRBS data in parallel based on the clock signal.

16. The device of claim 12 wherein the first circuitry comprises pre-emphasis circuitry and the second circuitry comprises equalization circuitry, the pre-emphasis circuitry and the equalization circuitry both operative (1) to decrease the bit error ratio of the recovered test data and (2) to be adapted based on the bit error ratio of the recovered test data.

17. The device of claim 12 wherein the selection circuitry selects based on a difference between the frequency associated with the clock signal and a frequency associated with a divided clock signal being greater than a predetermined parts per million.

18. A method for implementing a bit error ratio tester on an integrated circuit device that tests the bit error ratio of a device under test (DUT), comprising:
generating pseudo-random binary sequence (PRBS) data in a PRBS generator;
transmitting the PRBS data to the DUT;
receiving a data signal containing jitter and having embedded therein the PRBS data from the DUT;
generating from a system clock a clock signal having phase that steps, in time, across a data eye of the data signal;
generating a first control signal based on a frequency associated with the clock signal,
generating a second control signal based on the data signal, and
selecting as output one of the first and second control signals based on the frequency associated with the clock signal;
recovering the PRBS data from the data signal based on each of the steps in the phase of the clock signal; and
calculating, for each of the steps in the phase of the clock signal, a bit error ratio for the recovered PRBS data in a bit error ratio (BER) checker.

19. The method of claim 18 wherein transmitting the PRBS data comprises:
multiplying the system clock by a predetermined factor;
converting the PRBS data from the PRBS generator from parallel data to serial data;
transmitting the serial PRBS data to the DUT based on the multiplied system clock.

20. The method of claim 18 wherein, for each of the steps in the phase of the clock signal, recovering the PRBS data comprises:
generating a second clock signal that is phase-locked to the clock signal; and
recovering the PRBS data from the data signal based on the second clock signal.

21. The method of claim 18 wherein recovering the PRBS data further comprises:
converting the recovered PRBS data from serial data to parallel data; and
transmitting the parallel recovered PRBS data to the BER checker.

22. The method of claim 18 wherein generating a clock signal having phase that steps comprises delaying the phase of the system clock by a plurality of predetermined delay units.

23. The method of claim 18 further comprising adapting at least one of pre-emphasis and equalization based on the bit error ratio for the recovered PRBS data.

24. The method of claim 18 wherein the selecting is based on a difference between the frequency associated with the clock signal and a frequency associated with a divided clock signal being greater than a predetermined parts per million.

* * * * *